United States Patent [19]
Leroux et al.

[11] Patent Number: 5,962,173
[45] Date of Patent: Oct. 5, 1999

[54] METHOD FOR MEASURING THE EFFECTIVENESS OF OPTICAL PROXIMITY CORRECTIONS

[75] Inventors: Pierre Leroux, San Antonio, Tex.; Sethi Satyendra, San Jose, Calif.; David Ziger, San Antonio, Tex.

[73] Assignee: VLSI Technology, Inc., San Jose, Calif.

[21] Appl. No.: 08/951,396

[22] Filed: Oct. 16, 1997

Related U.S. Application Data

[63] Continuation-in-part of application No. 08/826,482, Mar. 27, 1997.
[51] Int. Cl.⁶ .................................................... G03F 9/00
[52] U.S. Cl. ........................ 430/5; 430/22; 430/394; 356/373; 356/375; 356/383; 356/384
[58] Field of Search ....................... 430/522, 394; 356/373, 375, 383, 384

[56] References Cited

U.S. PATENT DOCUMENTS

| | | | |
|---|---|---|---|
| 5,328,807 | 7/1994 | Tanaka et al. | 430/311 |
| 5,439,765 | 8/1995 | Nozue | 430/5 |
| 5,447,810 | 9/1995 | Chen et al. | 430/5 |
| 5,546,225 | 8/1996 | Shiraishi | 359/559 |
| 5,698,346 | 12/1997 | Sugawara | 430/5 |
| 5,700,602 | 12/1997 | Dao et al. | 430/5 |
| 5,731,109 | 3/1998 | Hwang | 430/5 |
| 5,798,195 | 8/1998 | Nishi | 430/22 |
| 5,800,951 | 9/1998 | Hashimoto | 430/5 |

OTHER PUBLICATIONS

"Optical/Laser Microlithography VIII", Feb. 1995, The International Society for Optical Engineering, vol. 2440.
"Optical Microlithography", Mar., 1997, The International Society for Optical Engineering, vol. 3051.
"Lithography", Semiconductor International, Sep., 1997.
"Optical Enhanced i–line Lithography . . . ", Solid State Technology, Mar., 1996, YEN, et al.

*Primary Examiner*—Nam Nguyen
*Assistant Examiner*—Steven H. Ver Steeg
*Attorney, Agent, or Firm*—Flehr Hohbach Test Albritton & Herbert LLP

[57] ABSTRACT

The effectiveness of various types of optical proximity correction schemes for avoiding line shortening are easily evaluated by imprinting a test pattern on a semiconductor wafer. The pattern includes an easily measurable standard measurement element not susceptible to line shortening and a test element having a series of parallel lines with narrow widths comparable to the widths of the circuit features that are susceptible to line shortening. The test element also includes the same optical proximity correction scheme whose effectiveness is to be measured. The entire test pattern is photolithographed onto the wafer and the lengths of measurement element and the test element are measured and compared to determine the effectiveness of the correction. Several test patterns, each with a different form of optical proximity correction, can be lithographed onto a single wafer for a comparative review of the different correction schemes both in focus and out of focus both positively and negatively.

26 Claims, 3 Drawing Sheets

METHOD FOR MEASURING THE EFFECTIVENESS OF OPTICAL PROXIMITY CORRECTIONS

RELATED APPLICATIONS

This application is a continuation-in-part of an application entitled Method for Measuring Dimensional Anomalies in Photolithographed Integrated Circuits Using Overlay Metrology, and Masks Therefor, Ser. No. 08/826,482, filed Mar. 27, 1997 naming the same inventors and assigned to the same assignee as hereof.

FIELD OF THE INVENTION

This invention relates generally to the field of fabricating integrated circuits and more particularly to maintaining accuracy in the fabrication of such circuits having extremely narrow line elements such as gate lines. One of the more important means for maintaining such accuracy is with the use of optical proximity correction (OPC) systems. One form of OPC is to utilize masks which include images that are distorted to an outline different from the outline of the desired feature; the difference being such as to reverse the anticipated distortion that would otherwise result from the printing system. One example of OPC is to provide a mask having the outline of a narrow line feature lengthened as compared to the line's "as drawn" length which is the intended length of the feature on the resist. Such OPC systems are extremely beneficial. However, in the fabrication of integrated circuits having extremely narrow lines on different levels of the circuit interconnected by conductive material deposited in vias extending from level to level, the accuracy of forming and positioning the lines and the vias becomes more and more critical. Minor errors in positioning such features can cause the via to miss the line altogether or to contact the line over too small a surface to provide the necessary conductivity for a useful circuit.

BACKGROUND OF THE INVENTION

In the manufacture of integrated circuits each element is ordinarily produced by a lithographic process wherein an image of one or several of the individual circuit elements or features is projected onto the wafer at a time. Because of the small size of such elements and the importance of their being accurately sized and positioned, the fabrication equipment is frequently checked for a number of possible dimensional anomalies and aberrations.

A usual method at the present time for making such checks and measuring discrepancies is with a traditional box in a box configuration having an outside box of about 20 $\mu$m square defined by a line or trench and a centrally disposed inside box of about 10 $\mu$m square similarly defined by a line or trench. In either case the box in a box configuration utilizes measurements between edges of the two boxes.

In some instances, such as defined in the above identified parent application, it is useful to take calibrating measurements of lines that, when printed, are narrow enough to be shortened to the same degree that the feature lines of the finished circuit will be shortened. The degree of line shortening can then be determined and the dimensions of the mask feature can be accurately lengthened to compensate for the expected line shortening when the mask is used to create the line feature on the resist. In addition to lengthening the mask line, other forms of line shortening corrections may be used. Examples include the use of enlargements at the ends of the lines in the form of hammerheads or various other forms of serifs. Very small island features (also known as pillar features) have the same shortening effect as narrow lines, but in two dimensions rather than one. Many of the same forms of correction used to correct line shortening can also be used to correct the shortening of both dimensions of islands.

In all cases it is important to recognize the capability of the overlay metrology tool and its need to recognize the edges of the two boxes. To provide this recognition, each of the two boxes must present a color shading discernibly different from the other so that their line of junction can be recognized. When one of the boxes is formed as a solid square rather than merely a line configuration, target acquisition by the metrology tool used to measure misalignment is facilitated.

Thus, if the outside box is formed of a solid sheet of chrome on glass and the inside box is formed by removing a square of the chrome to provide a view of clear glass, the difference in the color shading is at a maximum and the metrology machine can easily detect the juncture of the two. On the other hand, if one of the boxes is formed as a pattern of laterally spaced lines extending in the horizontal direction and the other of laterally spaced lines extending in the vertical direction, they will both exhibit the same color shading and therefore make target acquisition a very difficult task for the metrology tool. Furthermore, in making measurements, the metrology tool most easily recognizes various measurement points when the shading differences on each side of the various junctions are all substantially the same. Thus, if at one measurement point the shading on one side of the junction is much darker than the shading on the other side, the tool will seek junctions having the same difference of shading on the two sides.

In many instances, the individual features of a circuit, such as the gate lines, have extremely small dimensions and may have widths of less than 0.2 $\mu$m to 0.4 $\mu$m with their lengths being considerably greater, perhaps 0.8 $\mu$m to 2.0 $\mu$m. Moreover, the thin gate lines may well be intended for connection to other layers of the integrated circuit by way of narrow vias filled with electrically conductive material. When dimensions reach such small size there is not only a tendency for the formed line to be shorter than its design length as defined by the mask, but also the positioning of the vias may be misplaced sufficiently to cause less than adequate registration with the narrow gate line. Such critical dimension transfer difference occurs when a desired circuit feature is particularly thin or small because the light passed through the mask onto the resist to define the feature is refracted in the resist itself. With large features, the refracted light is relatively minor compared to the overall size of the feature. However, as the size of the feature diminishes that same degree of refraction impinges upon a larger percentage of the feature area. The effect of such refraction is increased when the projection is out of focus, thereby causing even more light scatter.

SUMMARY OF THE INVENTION

In accordance with the invention, instead of relying upon a determination of the degree of line shortening and redefining the drawn features with longer narrow lines to compensate for the expected line shortening, the specific manner of line shortening is itself used to prepare a box in a box configuration. The box in a box patterns may be printed in the scribe lines or die margins of a mask field. That configuration is then used in a normal manner to determine how accurately a particular type of line shortening compensation performs. Thus, a box in a box pattern is developed utilizing two adjacent solid sides of the box in a box square and sets of horizontal and vertical lines formed with the selected line shortening compensation. Such line shortening compensation may be as set forth above, that is, it may take the form of a lengthened line or a line having a hammerhead or some other form of serif at its ends. A number of box in a box configurations may be employed on the same mask each with a different type of line shortening compensation. The different types can then be compared with each other, not only at normal focus but in various ranges of defocus, both positive and negative. In such an arrangement, the operator may review the measure of the finished box in a box configurations as printed in a mask to determine their relative accuracy.

With masks in accordance with the invention the effectiveness of different corrective measures for line shortening and other optical proximity defects is measured. This is accomplished by imprinting accuracy determinative patterns in the scribe lines or die margins of the mask field. The patterns are ideally formed in the general nature of the usual box in a box configuration, the outer box having a dimension of approximately 20 μm square and the inner box having a dimension of approximately 10 μm square together defining a square ring having a distance of about 5 μm between the two boxes. In addition, the outer box is formed, at least in part, by a pattern of lines and/or islands having a width the same as the line or island of the feature being considered. The lines or islands include the same form of line shortening correction as is being used or being considered for use.

If the form of correction is the use of hammerhead ends on the lines, two adjacent arms of the outer box may be formed of solid chrome but the other two arms are formed of series of lines having hammerhead ends. Thus two adjacent arms are each about 5 μm wide rectangles formed of solid chrome. The other two arms are each formed of a series of lines having a width and a separation between lines with the same dimension as the lines under consideration. The lines, including the hammerhead, are also about 5 μm long or longer depending upon the hammerhead correction being employed.

Such patterns may be formed on the margins of the mask and printed under varying conditions of focus. After development, the pattern can be directly measured to determine the accuracy of that particular type of correction at any particular degree of focus. Indeed, multiple types of correction may be imprinted on the same wafer so as to measure which of the particular types is best for any given situation.

Generally, the distance across the solid chrome arms is measured and the distance across the "corrected" lines is also measured. In such a fashion the measurement across the solid chrome will reflect the distance with known accuracy. When that measurement is compared with the measurement of the "corrected" lines, the degree of accuracy of the correction is easily recognized. Such measurement may well show that one form of correction is best for an "in focus" exposure while another form is best for a positive defocus and still another form being best for a negative defocus in particular circumstances. While the description herein is directed to systems using positive resist, it should be recognized that the same principles may be employed with a negative resist system. In negative resist systems, the narrow lines are lengthened rather than shortened by the usual processing and the consequent correction is to shorten the otherwise lengthened line.

BRIEF DESCRIPTION OF THE DRAWINGS

Additional objects and features of the invention will be more readily apparent from the following detailed description and appended claims when taken in conjunction with the drawing, in which:

DESCRIPTION OF THE PREFERRED EMBODIMENTS

Figure 1:
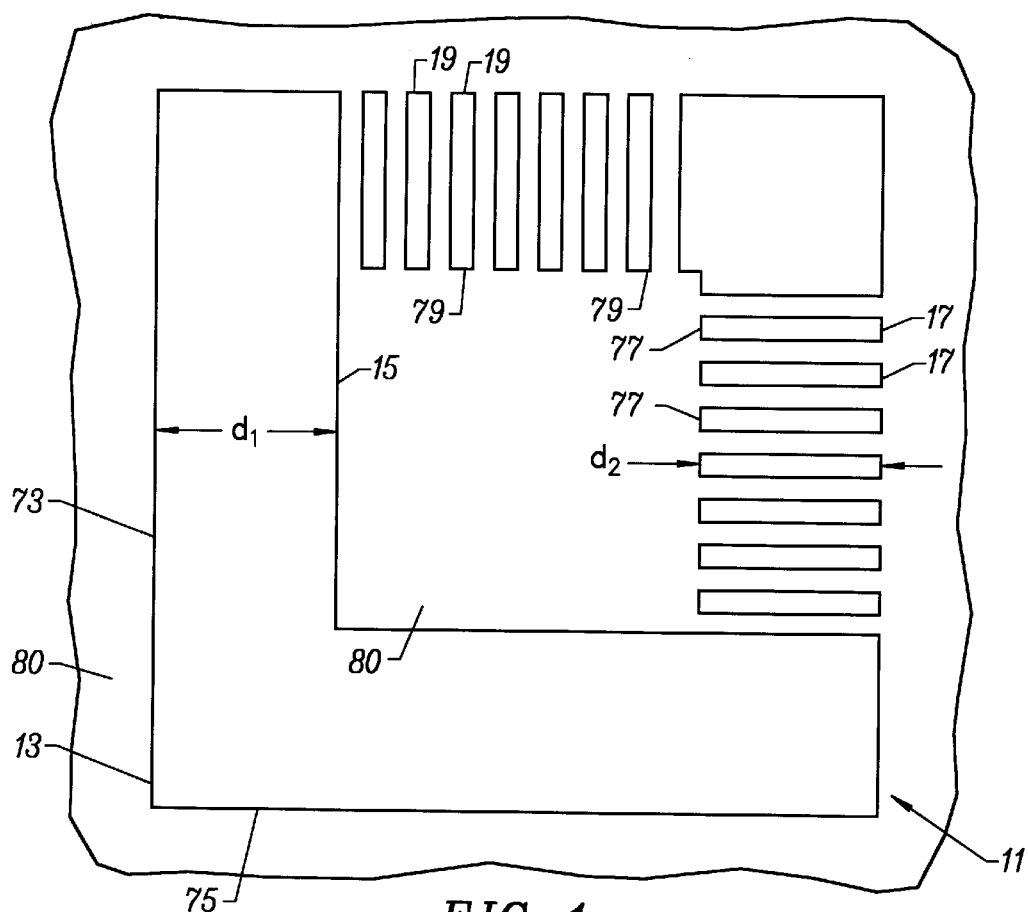
FIG. 1 is a generic schematic plan view of a line and space test pattern mask used in accordance with the invention for measuring the effectiveness of line shortening correction schemes.

Referring now to FIG. 1, there is shown, in schematic form, a generic test pattern 11 which can be photolithographed onto a wafer and used to determine the effectiveness of one or more types of line shortening correction. Measurements of the pattern will reflect the degree that the line shortening correction has been effective at any given focus. The test pattern 11 includes an outer box 13 and a centrally disposed inner box 15. Generally speaking, the outer box 13 may be about 20 μm square, with the inner box 15 being about 10 μm square. Thus, the distance $d_1$ between the left vertical side of the outer box and the left vertical side of the inner box 15 is about 5 μm. On the right side of the pattern, there is no solid vertical line forming wide measurement edges from which the distance $d_2$ can be measured. Rather, there is a series of horizontal bars or mask line features 17 providing narrow measurement edges. The mask line features 17 each have a nominal length of 5 μm. The width of the mask line features 17 is selected to be the same as that of the lines of the semiconductor feature to be formed. For instance, if the semiconductor feature were to have a width of 0.35 μm, the width of the mask line features 17 would likewise be 0.35 μm. Preferably, the mask line features are spaced from each other by a distance equal to their width.

Ordinarily, measurement of the distance $d_1$ is very straightforward and it will be measured as 5 μm within a few angstroms. Because of the line shortening effect, the distance $d_2$ would not ordinarily be measured as 5 μm but as something less—in the order 4.9 μm. However, if the line shortening correction is fully effective, the measurement will be 5 μm. Any deviation from the nominal 5 μm will indicate a degree of ineffectiveness for the particular correction being used at the particular focus then employed.

In addition to the mask line features 17 extending horizontally in the test pattern of FIG. 1, there is also a series of vertical mask line features 19 for making effectiveness measurements in the vertical direction as opposed to the horizontal direction with the mask line features 17. In FIG. 1 the mask line features 17 and 19, being shown on a very small scale, are shown only in their generic shape. The mask line features themselves, in various embodiments, are shown more particularly in FIGS. 3 through 8 in comparison with FIG. 2 which shows such a mask line feature without any correction.

Figure 2:
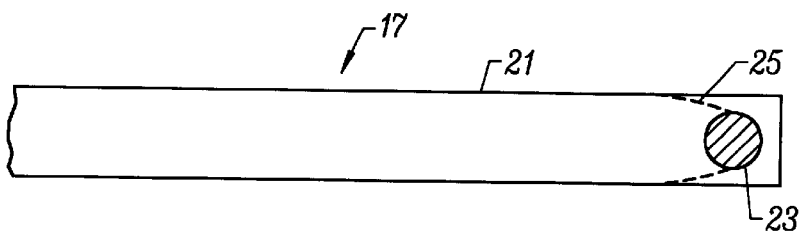
FIG. 2 is an enlarged schematic view of a portion of the mask of FIG. 1 showing a narrow line circuit feature as intended or "drawn" and, in dashed lines, the feature as actually printed on resist without any correction.

Referring specifically to FIG. 2, an end portion of one of the mask line features 17 is shown in enlarged scale. The "as drawn" configuration (that is, the feature as intended to be reproduced on the resist) is shown in solid lines 21. Also shown in FIG. 2 is an area 23 representing the position of a via to be formed at a later time for a contact with the actual line feature. If the mask line feature, that is the feature as formed on the mask, is created with the same outline as the intended resist feature, that is, in the shape shown by the solid lines 21, the resultant feature on the resist would be altered as shown by the dashed line 25. This resultant line feature is not only notably shortened but is also somewhat narrowed at the end. It should be recognized that, with the narrowed end, the chances of the final resist line feature being out of registration with a via is far more likely than if the feature had its full "as drawn" width shown by the lines 21.

Figure 3:
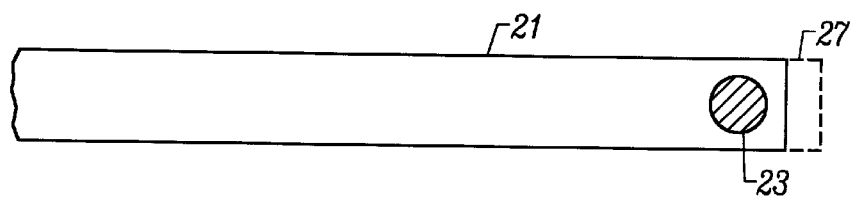
FIG. 3 is an enlarged schematic view of the narrow circuit line feature of FIG. 2 but also showing, in dashed lines, the feature as actually formed on the mask with line lengthening as the correction scheme.
Figure 4:
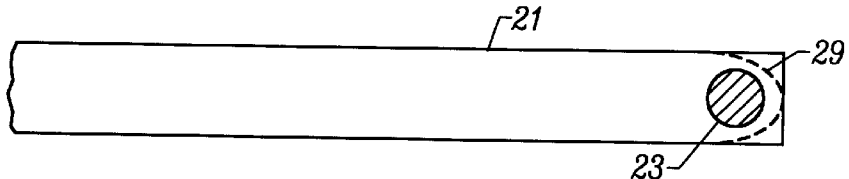
FIGS. 4 is an enlarged schematic view showing the intended or "drawn" feature of FIGS. 2 and 3 and, in dashed lines, the resulting resist pattern which is formed with the application of the line lengthening correction as shown in FIG. 3.

Referring to FIG. 3, one form of correction is shown—actual lengthening of the mask line feature. The lengthened portion of the line 27 is added to the "as drawn" length of the line. When the mask is used to print the resist feature, the feature is formed as shown in FIG. 4. Notably, the resist feature 29 is still tapered at the end as is the feature 25 shown in FIG. 2. However, since the feature 29 is longer than the feature 25 of FIG. 2, its tapered portion is wider in the area of the via 23. Consequently, there is less likelihood that a later formed via will be out of registry with the actual line feature formed with the line shortening correction.

Figure 5:
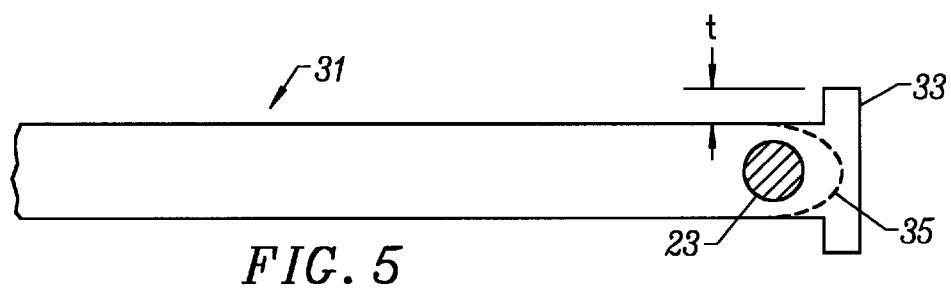
FIG. 5 is an enlarged schematic view showing a portion of a narrow line circuit feature mask with hammerhead line correction and, in dashed lines, the feature as actually printed using such correction.

Instead of merely lengthening the mask line feature, the line shortening correction may take other forms. One such form is shown in FIG. 5 wherein the end of the mask line element 31 is not only extended but is extended in the form of a hammerhead 33. Preferably the hammerhead 33 extends beyond the "as drawn" line element and also extends laterally of the line element. Preferably the lateral extensions is approximately one-twelfth of the wave length of the radiation being used with the mask and the longitudinal extension is one-sixth of that wavelength. Thus, if the mercury I line radiation (3,650 Å) is used, the lateral extensions "t" as shown in FIG. 5 would be approximately 0.03 μm and the longitudinal extension would be 0.06 μm. If the mercury g line (4,360 Å) were used, the lateral and longitudinal extensions should be in the neighborhood of 0.035 μm and 0.70 μm respectively; and if DPV (deep ultra-violet or 2,480 Å) extensions of only 0.02 μm and 0.04 μm would be preferred.

With such a hammerhead configuration the shape of the resist feature would take the form as shown at 35 in FIG. 5 being still tapered but somewhat broader than that shown in FIGS. 4 and 2. Thus, the likelihood of a misregistration between the formed line feature itself and the via 23 is less likely than in the previous examples.

Figure 6:
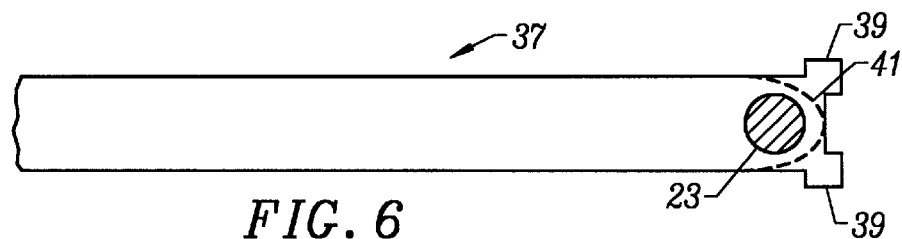
FIG. 6 is an enlarged schematic view similar to FIG. 5 but showing a narrow line circuit feature with eared corner serifs as the line correction and, in dashed lines, the feature as actually printed using such correction.

Still another form of line shortening correction is shown in FIG. 6 where the mask line element 37 incorporates a pair of eared serifs 39 at the end corners. Again, the preferred dimensions of the extensions formed by the serifs 39 can be calculated as above from the wavelength of the radiation being employed. As noted by the line 41 showing the resultant resist feature, the serifs 39 serve to widen the end taper of the line making the resist feature still wider in the area of the potential vias 23.

Figure 7:
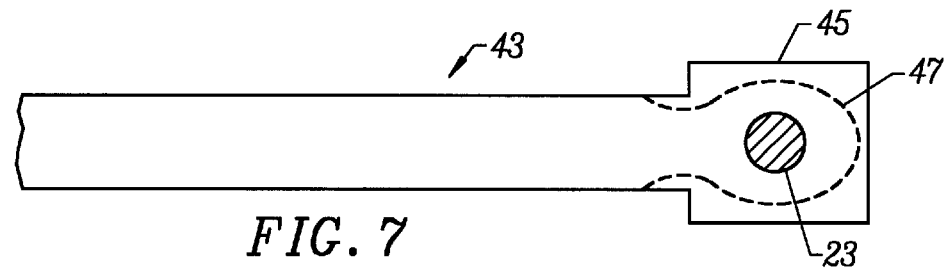
FIG. 7 is an enlarged schematic view similar to FIG. 5 but showing a portion of a narrow line circuit feature with a large uniform flat serif as the line correction and, in dashed lines, the feature as actually printed using such correction.

Referring to FIG. 7, there is still another form of line shortening correction wherein the entire end of the mask line element 43 is widened all along the area adjacent the anticipated via point 23. The widened end 45 of the mask line element 43 provides still broader taper of the resultant resist feature 47 than in the previous embodiments. Thus, there is still more margin for error in the positioning of the line element itself with the via.

Figure 8:
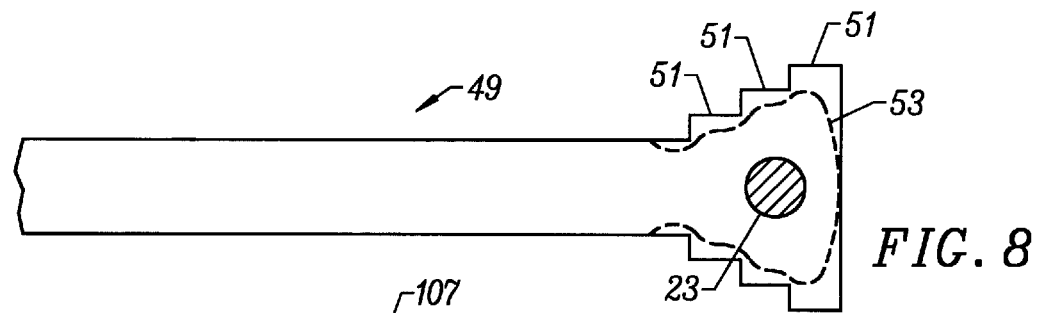
FIG. 8 is an enlarged schematic view similar to FIG. 5 but showing a portion of a narrow line circuit feature with a stepped flat serif as the line correction and, in dashed lines, the feature as actually printed using such correction.

Referring now to FIG. 8, there is still another line shortening correction. In this instance, the line shortening scheme includes a mask line element 49 wherein the end of the mask includes a series of steps 51, the wider steps being at the very end of the line which, of course, is most susceptible to the refraction causing light shortening. In such a stepped line end correction the resultant resist feature 53 is relatively wide in the area of the via 23 thus providing a suitable margin of error for registry of the via 23 with the resultant line element.

Figure 10:
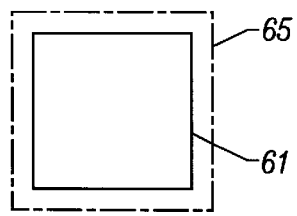
FIG. 10 is an enlarged schematic view similar to FIG. 9 but showing a portion of a small island circuit feature as intended or "drawn" and, in dot-dashed lines, the feature as actually formed on the mask with line lengthening correction.

While the line shortening corrections shown in FIGS. 3 through 8 relate specifically to lines, FIGS. 9 through 12 are directed to pillar or island features and the "line" shortening relevant to such islands. Specifically, in FIG. 9, there is shown a small island circuit feature 61 "as drawn". If the mask were to display such a feature as drawn the resultant resist feature would be developed as shown by the dashed lines 63. Thus, the dimensions of the island feature will be reduced in both horizontal and vertical directions providing a substantially smaller island than designed. FIG. 10 shows a line shortening compensation for islands comparable to that of FIG. 3 shown for lines. In FIG. 10, the "as drawn" feature 61 is again shown and, in dot-dashed line 65, there is shown a mask feature for that particular element. The mask feature is enlarged in both directions by an amount corresponding to the expected line shortening. In FIG. 11, the mask 65 is again shown as is the resist feature 67 as actually printed with the corrective mask 65. It should be noted that the actual imprinted resist feature 67 corresponds very closely to the "as drawn" feature 61 except for rounding of the corners themselves.

Figure 12:
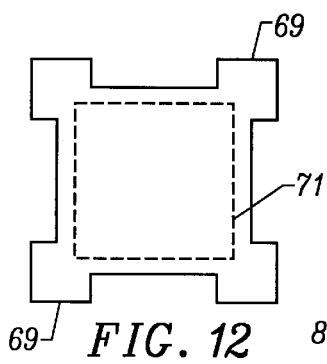
FIG. 12 is an enlarged schematic view showing a portion of a small island circuit feature with eared corner serifs as the line correction and, in dashed lines, the feature as actually printed using such correction.

Referring to FIG. 12, a mask is shown with a different form of correction, including eared serifs 69, comparable to those shown in FIG. 6. The serifs, of course, provide increased size in both the horizontal and the vertical directions at the corners. In this case, the resultant island resist feature 71 not only includes dimensions very close to the "as drawn" dimensions but also includes far more squared corners as in the "as drawn" feature.

The test pattern shown in FIG. 1 may incorporate lines 17 and 19 having the line shortening correction of any of the FIGS. 3 through 8 as well as any of the other possible line shortening features which are not shown. It should be recognized, however, that care must be taken if the line shortening correction takes the form of a hammerhead as shown in FIG. 5 or any of the other types of correction which incorporate a widening of the line end. The widening should not extend so far as to overlap or even meet the corresponding hammerhead or serif of the adjacent lines. Thus, if lines of 0.2 $\mu$m are employed and the lines are spaced by 0.2 $\mu$m the hammerhead widening on each side of the line cannot be as great as 0.1 $\mu$m. If it were, the meeting hammerheads would themselves form a continuous line along the edge. This caveat is particularly important in those embodiments of line shortening as shown in FIGS. 7 through 8 wherein the serif extends a substantial distance along the length of the line. If the serifs were wide enough to meet the serifs of the adjacent lines, the resultant resist pattern may not accurately reflect the effectiveness of the particular line shortening method.

While each of the line features shown in FIGS. 3 through 8 may be employed in the test pattern of FIG. 1, the island features of the type shown in FIGS. 9 through 12 may also be used. It should be recognized that in the test pattern shown in FIG. 1, two legs 73 and 75 of the outer box 13 appear as solid opaque rectangles, whereas the legs 77 and 79 are formed with closely spaced lines. These legs 73, 75, 77 and 79 may be formed as a layer of metal or polysilicon on a substrate 80.

Figure 13:
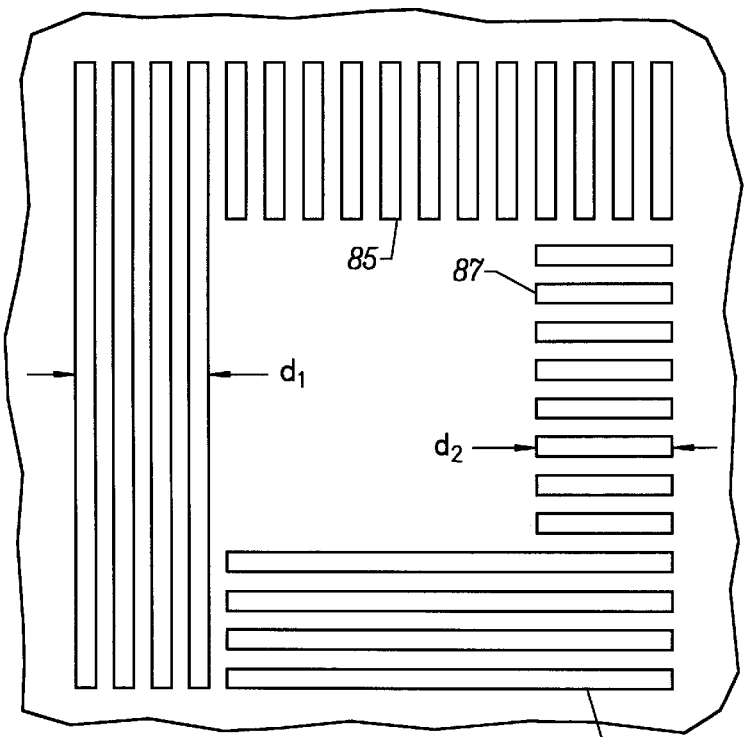
FIG. 13 is a schematic plan view of another pattern used in accordance with the invention for measuring line shortening, this pattern using only horizontal and vertical lines.

When viewed by the metrology tool to make measurements, the interface between the leg 73 and the substrate 80 both outside the outer box 13 and in the inner box 15 is far more pronounced than is the interface of the leg 77 with the substrate 80. With this difference in contrast, there is, in some instances, a target acquisition difficulty on the part of the metrology tool in recognizing both interfaces. In order to overcome this problem, the outer box may itself be formed of a series of lines such as shown in FIG. 13. In FIG. 13, an outer box includes series of parallel lines forming adjacent leg rectangles 81 and 83. The parallel lines of the rectangles 81 and 83 are of the same width and spacing as the spaced lines forming the rectangles 85 and 87. When the rectangles 81 and 83 are measured, the measurement is across the length of the lines rather than along their length as is the case for the rectangles 85 and 87. Thus, the same accuracy is obtained measuring across the rectangle 81 as is measuring across the rectangle 73 of FIG. 1 to arrive at the dimension $d_1$.

Because the leg rectangles 81,83,85 and 87 of FIG. 13 are all formed of a series of spaced lines, the color shading is the same for all the rectangles. These are be contrasted equally with the clear inner box and therefor the target acquisition of the metrology tool is considerably facilitated. When the rectangles 81 and 83 are formed of lines as shown in FIG. 13, the dimension $d_1$, may well not be exactly 5 $\mu$m. In such a rectangle, each outside line should be of the full line thickness and the lines and spaces are chosen to be of the same width as the intended line features. Thus, and integral number of lines and spaces may well not add up to 5 $\mu$m. The measurement may well be 4.8 $\mu$m. In such a case, the length of the lines in the rectangle 87 should also be made to be 4.8 $\mu$m plus whatever correction is being used.

Figure 11:
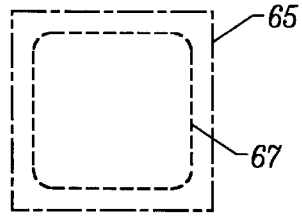
FIG. 11 is an enlarged schematic view showing the mask feature of FIG. 10 and, in dashed lines, the feature as actually printed.
Figure 14:
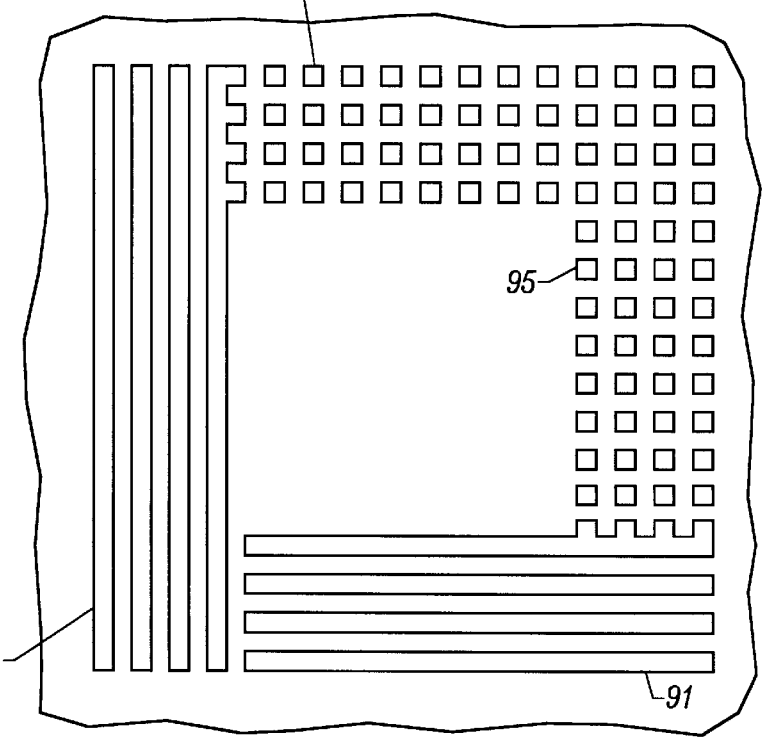
FIG. 14 is a schematic plan view of still another pattern used in accordance with the invention for measuring line and island shortening, this pattern using grouped lines and islands.

Referring now to FIG. 14, there is again shown a test pattern having adjacent legs 89 and 91 formed of line elements, but the adjacent leg rectangles 93 and 95 are formed of a series of island like elements of the type shown in FIGS. 11 or 12. Here, particularly it is important that the rectangles 89 and 91 be formed of lines rather than solid mass so as to provide the metrology tool with a more similar contrast with the clear inner circle than would be the case if the rectangles 89 and 91 were solidly opaque.

Figure 15:
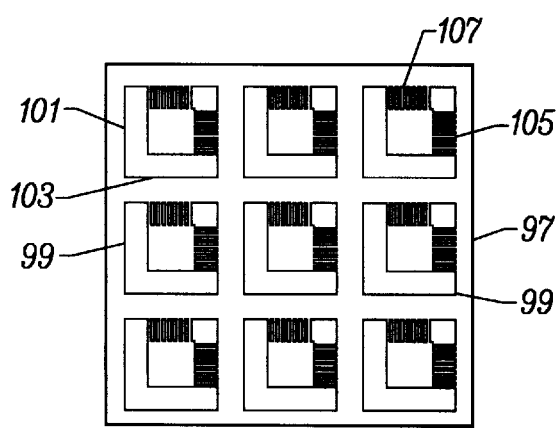
FIG. 15 is a schematic plan view of a mask having a number of test patterns for testing different types shortening at the same time.
Figure 9:
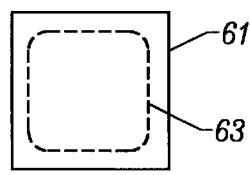
FIG. 9 is an enlarged schematic view of a portion of a small island circuit feature showing the intended or "drawn" feature and, in dashed lines, the feature as actually printed without any correction.

While the description hereinabove has been predominately about single test patterns, there is shown in FIG. 15 a mask 97 including a plurality of test patterns 99. Each of the test patterns 99 may be of the type shown in FIG. 1, 13 or 14. That is, they may include solid rectangles or rectangles formed of spaced lines to form the standard measurement elements 101 and 103. The test elements 105 and 107 may be formed with any of the line correction elements shown in FIGS. 3 through 8 or any other form of correction. With such a test pattern, various types of line correction can be measured simultaneously.

While the present invention has been described with references to a few specific embodiments, the description is only illustrative of the invention and should not be construed as limiting the invention. Various modifications may occur to those skilled in the art without departing from the true spirit and scope of the invention as defined by the appending claims. For instance, the reference has been made to the box in the box configuration but it should be recognized that other formations may be utilized. It should also be recognized that although a box in a box has been shown and described, the important elements of the boxes are the rectangles which are used for measuring dimensions $d_1$ and $d_2$ and, when vertical measurements are desired, a similar pair of rectangles is required to measure across those rectangles.

We claim:

1. A method of measuring the effectiveness of an optical proximity correction scheme employed to compensate for line shortening effect arising when forming narrow circuit features in an integrated circuit on a semiconductor wafer comprising:

preparing a mask having a test pattern, said test pattern including;
a standard measurement element having a first nominal dimension, the ends of which being defined by measurement edges having widths sufficient to effectively preclude line shortening and
a test element having a series of parallel lines of a second nominal dimension, at least one of the ends of which being defined by a measurement edge having a width comparable to the width of said circuit features and also including the optical proximity correction scheme whose effectiveness is to be measured;

photolithographing said test pattern onto a wafer; and measuring the lengths of said standard and test element of said test pattern as photolithographed onto said wafer.

2. The method of measuring the effectiveness of an optical proximity correction scheme on a semiconductor wafer as described in claim 1 wherein said first and said second nominal dimensions are equal.

3. The method of measuring the effectiveness of an optical proximity correction scheme on a semiconductor wafer as described in claim 1 wherein said parallel lines are spaced from each other by a distance equal to the width of said lines.

4. The method of measuring the effectiveness of an optical proximity correction scheme on a semiconductor wafer as described in claim 1 wherein said test pattern includes an island pattern including an array of island elements each of which has an individual length equal to its width.

5. The method of measuring the effectiveness of an optical proximity correction scheme on a semiconductor wafer as described in claim 1 wherein a plurality of said test patterns are prepared said plurality of test patterns including different optical proximity correction schemes.

6. The method of measuring the effectiveness of an optical proximity correction scheme on a semiconductor wafer as described in claim 1 wherein said optical proximity correction scheme is a lengthening of the lines of said second nominal dimension.

7. The method of measuring the effectiveness of an optical proximity correction scheme on a semiconductor wafer as described in claim 1 wherein said optical proximity correction scheme is the addition of a serif at the ends of said second nominal dimension.

8. The method of measuring the effectiveness of an optical proximity correction scheme on a semiconductor wafer as described in claim 7 wherein said serif is a hammerhead configuration.

9. The method of measuring the effectiveness of an optical proximity correction scheme on a semiconductor wafer as described in claim 7 wherein said serif is an eared configuration.

10. The method of measuring the effectiveness of an optical proximity correction scheme on a semiconductor wafer as described in claim 7 wherein said serif is a uniform enlargement of the sides of the parallel lines at the ends thereof.

11. The method of measuring the effectiveness of an optical proximity correction scheme on a semiconductor wafer as described in claim 7 wherein said serif is stepped.

12. The method of measuring the effectiveness of an optical proximity correction scheme on a semiconductor wafer as described in claim 1 wherein said standard measurement element comprises a series of lines and spaces.

13. A single mask for measuring the effectiveness of an optical proximity correction scheme employed to compensate for line shortening effect arising when forming narrow circuit features in an integrated circuit on a semiconductor wafer with a stepper lens, said mask including a test pattern resolvable on a wafer comprising:

a standard measurement element having a first nominal dimension, the ends of which being defined by measurement edges having widths sufficient to effectively preclude line shortening by said stepper lens and a test element having a series of parallel lines of a second nominal dimension, at least one of the ends of which being defined by a measurement edge having a width comparable to the width of said circuit features and subject to line shortening by said stepper lens and also including the optical proximity correction scheme whose effectiveness is to be measured.

14. A mask as described in claim 13 wherein said first and said second nominal dimensions are equal.

15. A mask as described in claim 13 wherein said parallel lines are spaced from each other by a distance equal to the width of said lines.

16. A mask as described in claim 13 wherein said test pattern includes an island pattern including an array of island elements each of which has an individual length equal to its width.

17. A mask as described in claim 13 wherein a plurality of said test patterns are prepared; said plurality of test patterns including different optical proximity correction schemes.

18. A mask as described in claim 13 wherein said optical proximity correction scheme is a lengthening of the lines of said second nominal dimension.

19. A mask as described in claim 13 wherein said optical proximity correction scheme is the addition of a serif at the ends of said second nominal dimension.

20. A mask as described in claim 19 wherein said serif is a hammerhead configuration.

21. A mask as described in claim 19 wherein said serif is an eared configuration.

22. A mask as described in claim 19 wherein said serif is a uniform enlargement of the sides of the parallel lines at the ends thereof.

23. A mask as described in claim 19 wherein said serif is stepped.

24. A mask as described in claim 13 wherein said standard measurement element comprises a series of lines and spaces.

25. A single mask for measuring the effectiveness of an optical proximity correction scheme employed to compensate for line shortening effect arising when forming narrow circuit features in an integrated circuit on a semiconductor wafer with a stepper lens comprising:

an array of test patterns disposed throughout the area of the mask;
each of said test patterns in said array being resolvable on a wafer and including;
a standard measurement element having a first nominal dimension, the ends of which being defined by measurement edges having widths sufficient to effectively preclude line shortening by said stepper lens and
a test element having a series of parallel lines of a second nominal dimension, at least one of the ends of which being defined by a measurement edge having a width comparable to the width of said circuit features and subject to line shortening by said stepper lens and also including the optical proximity correction scheme whose effectiveness is to be measured.

26. A mask as defined in claim 25 wherein said array of test patterns includes test patterns having different optical proximity correction schemes.

* * * * *